US008379882B2

(12) United States Patent
Lee

(10) Patent No.: US 8,379,882 B2
(45) Date of Patent: Feb. 19, 2013

(54) METHOD AND ELECTRONIC DEVICE FOR DRIVING A CAPACITANCE ELECTRO-ACOUSTIC TRANSDUCER

(75) Inventor: Fang-Ching Lee, Taoyuan County (TW)

(73) Assignee: HTC Corporation, Taoyuan, Taoyuan County (TW)

( * ) Notice: Subject to any disclaimer, the term of this patent is extended or adjusted under 35 U.S.C. 154(b) by 467 days.

(21) Appl. No.: 12/484,243

(22) Filed: Jun. 14, 2009

(65) Prior Publication Data

US 2010/0092010 A1  Apr. 15, 2010

(30) Foreign Application Priority Data

Oct. 15, 2008  (TW) ................. 97139500 A

(51) Int. Cl.
*H04R 3/00* (2006.01)
*H04R 25/00* (2006.01)
*H03G 3/00* (2006.01)
*H03F 99/00* (2009.01)

(52) U.S. Cl. ........ 381/116; 381/111; 381/107; 381/120; 381/191

(58) Field of Classification Search .............. 381/191, 381/190, 116, 120, 98, 104, 107, 108, 74, 381/111, 113, 174, 119
See application file for complete search history.

(56) References Cited

U.S. PATENT DOCUMENTS

| 4,799,265 | A | | 1/1989 | Streng |
| 5,677,965 | A | * | 10/1997 | Moret et al. ................. 381/191 |
| 6,044,162 | A | | 3/2000 | Mead |
| 6,295,365 | B1 | | 9/2001 | Ota |
| 6,621,335 | B2 | * | 9/2003 | Andersson ................. 330/10 |
| 2002/0141606 | A1 | | 10/2002 | Schweder |
| 2004/0047477 | A1 | | 3/2004 | Bank |
| 2004/0208311 | A1 | | 10/2004 | Igarashi |
| 2007/0025575 | A1 | | 2/2007 | Oser |

(Continued)

FOREIGN PATENT DOCUMENTS

| CN | 201054779 Y | 4/2008 |
| JP | S6328199 A | 2/1988 |

(Continued)

OTHER PUBLICATIONS

Tithe: Ultra-Miniature DC to HV DC Converter—Q Series—Product of the year award 1988 EE Product News; Dated 1998; Publisher: EMCO.*

(Continued)

*Primary Examiner* — Xu Mei
*Assistant Examiner* — David Ton
(74) *Attorney, Agent, or Firm* — Winston Hsu; Scott Margo

(57) ABSTRACT

An electronic device includes a capacitance electro-acoustic transducer and an audio driver. The audio driver is coupled to the capacitance electro-acoustic transducer. The audio driver includes a high-voltage amplifier for receiving an input audio signal and for transforming the input audio signal into an output audio signal to drive the capacitance electro-acoustic transducer, wherein an absolute voltage value of the input audio signal is smaller than an absolute voltage value of the output audio signal. The output bandwidth of the capacitance electro-acoustic transducer is controlled by the magnitude of the output current of the audio driver. The capacitance electro-acoustic transducer of the present invention can meet different bandwidth requirements and thus achieve saving power, which cannot be achieved by a traditional dynamic electro-acoustic transducer.

16 Claims, 5 Drawing Sheets

U.S. PATENT DOCUMENTS

| | | | |
|---|---|---|---|
| 2007/0121970 A1* | 5/2007 | Miyazaki | 381/116 |
| 2007/0189559 A1 | 8/2007 | Haan | |
| 2007/0242844 A1* | 10/2007 | Harman | 381/191 |
| 2007/0274558 A1 | 11/2007 | Lyon | |
| 2010/0303263 A1* | 12/2010 | Hiensch | 381/191 |

FOREIGN PATENT DOCUMENTS

| | | |
|---|---|---|
| JP | 2001516523 A | 9/2001 |
| JP | 2005109665 A | 4/2005 |
| JP | 2007174619 A | 7/2007 |
| JP | 2007181176 A | 7/2007 |
| JP | 2008148288 A | 6/2008 |
| WO | 9828943 | 7/1998 |
| WO | 2008002049 A1 | 1/2008 |

OTHER PUBLICATIONS

Office action mailed on Jul. 26, 2011 for the Japanese application No. 2009-128052, filing date May 27, 2009, p. 1-3.

R. Chebli et al., "A CMOS high-voltage DC-DC up converter dedicated for ultrasonic applications", Proceedings of the 4th IEEE International Workshop on System-on-Chip for Real-Time Applications (IWSOC'04). 4th IEEE International Workshop on Digital Object Identifier: 10.1109/IWSOC.2004.1319862, Publication Year: 2004, pp. 119-122, IEEE Conference Publications.

Office action mailed on Jul. 31, 2012 for the Taiwan application No. 097139500, filing date Oct. 15, 2008, p. 1-11.

* cited by examiner

METHOD AND ELECTRONIC DEVICE FOR DRIVING A CAPACITANCE ELECTRO-ACOUSTIC TRANSDUCER

BACKGROUND OF THE INVENTION

1. Field of the Invention

The present invention relates to a method for driving a capacitance electro-acoustic transducer and a related electronic device, and more particularly, to a method and a related electronic device for driving the capacitance electro-acoustic transducer with high voltages/low currents to control its bandwidth and power consumption.

2. Description of the Prior Art

Due to the popularity of digital music, portable music players as well as portable devices with music playback functions can be found everywhere. The requirement for power consumption is stressed by the portable devices. Take a portable multimedia device with a built-in speaker as an example, the power consumption of the speaker approximately accounts for 20%-70% of the whole power consumption. A traditional dynamic speaker is driven by an amplifier with large currents/low voltages, and its power consumption is about 1.5-2 W when the output sound volume at 10 cm away is a stereo with 93 db-100 dB. With regard to a portable multimedia device, the power consumption is too high.

Therefore, how to save the power consumption of the speaker in order to improve the usage time of the portable multimedia device becomes an important topic of the field.

SUMMARY OF THE INVENTION

It is one of the objectives of the present invention to provide a method for driving a capacitance electro-acoustic transducer and a related electronic device to achieve a goal of saving power by using the physical characteristics of low power consumption of the capacitance electro-acoustic transducer.

The present invention discloses an electronic device. The electronic device includes a capacitance electro-acoustic transducer and an audio driver. The audio driver is coupled to the capacitance electro-acoustic transducer. The audio driver includes a high-voltage amplifier for receiving an input audio signal and for transforming the input audio signal into an output audio signal to drive the capacitance electro-acoustic transducer, wherein an absolute voltage value of the input audio signal is smaller than an absolute voltage value of the output audio signal. The capacitance electro-acoustic transducer can be an electret speaker or an electret earphone, and the capacitance electro-acoustic transducer includes an electret diaphragm and a perforated electrode plate.

The present invention discloses a method for driving a capacitance electro-acoustic transducer. The method includes the steps of: using a high-voltage amplifier to receive an input audio signal and transforming the input audio signal into an output audio signal, wherein an absolute voltage value of the input audio signal is smaller than an absolute voltage value of the output audio signal; and driving the capacitance electro-acoustic transducer according to the output audio signal of the high-voltage amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
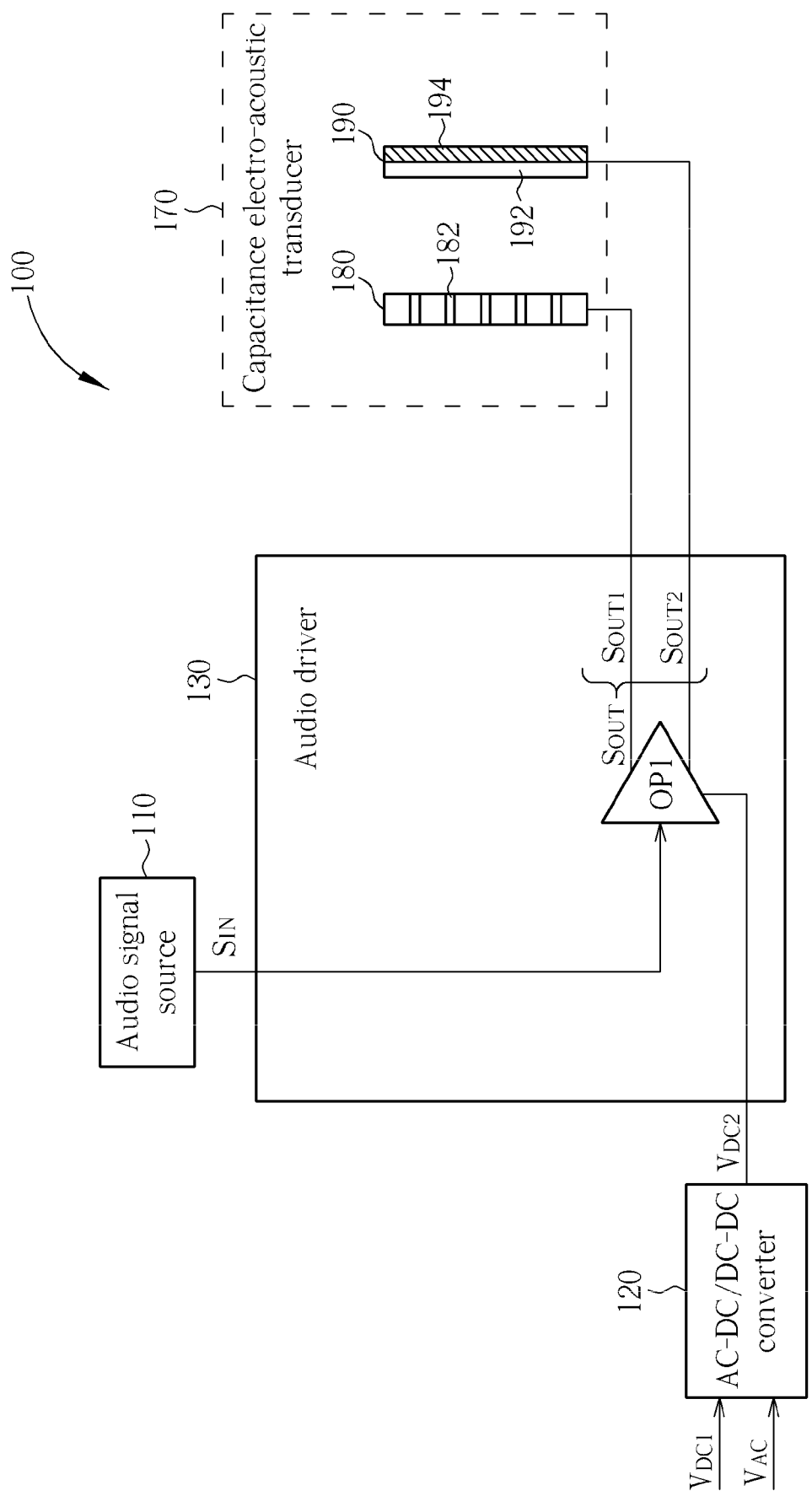
FIG. 1 is a diagram of an electronic device for driving a capacitance electro-acoustic transducer according to a first embodiment of the present invention.

Please refer to FIG. 1. FIG. 1 is a diagram of an electronic device 100 for driving a capacitance electro-acoustic transducer according to a first embodiment of the present invention. As shown in FIG. 1, the electronic device 100 includes, but is not limited to, an audio signal source 110, an AC-DC/DC-DC converter 120, an audio driver 130, and a capacitance electro-acoustic transducer 170. The audio signal source 110 provides an input audio signal $S_{IN}$, such as audio signals provided by portable multimedia devices like an MP3 player, a CD player, or a smart phone. The audio driver 130 is coupled to the audio signal source 110, the AC-DC/DC-DC converter 120, and the capacitance electro-acoustic transducer 170. The audio driver 130 includes a high-voltage amplifier OP1 for receiving the input audio signal $S_{IN}$ and for transforming it into an output audio signal $S_{OUT}$ to drive the capacitance electro-acoustic transducer 170, wherein an absolute voltage value of the input audio signal $S_{IN}$ is smaller than an absolute voltage value of the output audio signal $S_{OUT}$. Generally speaking, the input audio signal $S_{IN}$ is substantially 0-3 Vpp, and the output audio signal $S_{OUT}$ is substantially greater than 84 Vpp. The AC-DC/DC-DC converter 120 is coupled to the high-voltage amplifier OP1 for converting an AC voltage $V_{AC}$ with 110V-220V or a first DC voltage $V_{DC1}$ into a second DC voltage $V_{DC2}$, wherein the second DC voltage $V_{DC2}$ is greater than the first DC voltage $V_{DC1}$. The second DC voltage $V_{DC2}$ acts as a power supply of the high-voltage amplifier OP1. The first DC voltage $V_{DC1}$ is substantially 2.5V-5V, and the second DC voltage $V_{DC2}$ is substantially 80V-100V.

Please note that the electronic device 100 can be a mobile phone, a game console, or a PDA. But this should not be considered as limitations of the present invention, the electronic device 100 can be a multimedia electronic device of other types. Furthermore, the capacitance electro-acoustic transducer 170 can be an electret speaker or an electret earphone, but the present invention is not limited to this only and can be another type of capacitance electro-acoustic transducer. Please keep referring to FIG. 1, the capacitance electro-acoustic transducer 170 includes a perforated electrode plate 180 and an electret diaphragm 190. The perforated electrode plate 180 has a plurality of holes 182. The electret diaphragm 190 has a diaphragm body 192 and an electrode layer 194. The diaphragm body 192 is charged (not shown in FIG. 1), and can be composed of PTFE or FEP. This should not be limitations of the present invention. The electrode layer 194 can be composed of aluminum (Al), chromium (Cr), or other conductive materials.

In this embodiment, the input audio signal $S_{IN}$ is a single-ended signal, and the output audio signal $S_{OUT}$ is a pair of differential signals having a first signal $S_{OUT1}$ and a second signal $S_{OUT2}$. The present invention is not limited to this only, and the input audio signal $S_{IN}$ can be a single-ended signal or a pair of differential signals and the output audio signal $S_{OUT}$ can be a single-ended signal or a pair of differential signals. When the output audio signal $S_{OUT}$ is a pair of differential signals, the perforated electrode plate 180 of the capacitance electro-acoustic transducer 170 receives the first signal $S_{OUT1}$ of the pair of differential signals and the electret diaphragm 190 of the capacitance electro-acoustic transducer 170 receives the second signal $S_{OUT2}$ of the pair of differential signals, as is shown in FIG. 1. When the output audio signal $S_{OUT}$ is a single-ended signal, the electret diaphragm 190 of the capacitance electro-acoustic transducer 170 receives the single-ended signal and the perforated electrode plate 180 is coupled to the ground (not shown).

In short, the audio signal source 110 of the electronic device 100 provides the input audio signal $S_{IN}$ (such as 1.68 Vpp) to the high-voltage amplifier OP1 of the audio driver 130. The AC-DC/DC-DC converter 120 converts the AC voltage $V_{AC}$ with 110V-220V or the first DC voltage $V_{DC1}$ into the second DC voltage $V_{DC2}$ (such as 84V), and then provides the second DC voltage $V_{DC2}$ as a power supply to the high-voltage amplifier OP1. Finally, the high-voltage amplifier OP1 transforms the input audio signal $S_{IN}$ into the output audio signal $S_{OUT}$ (for example, the first signal $S_{OUT1}$ is +84 Vp and the second signal $S_{OUT2}$ is −84 Vp) to drive the capacitance electro-acoustic transducer 170. In this embodiment, the high-voltage amplifier OP1 drives the capacitance electro-acoustic transducer 170 with high voltages/low currents.

Figure 2:
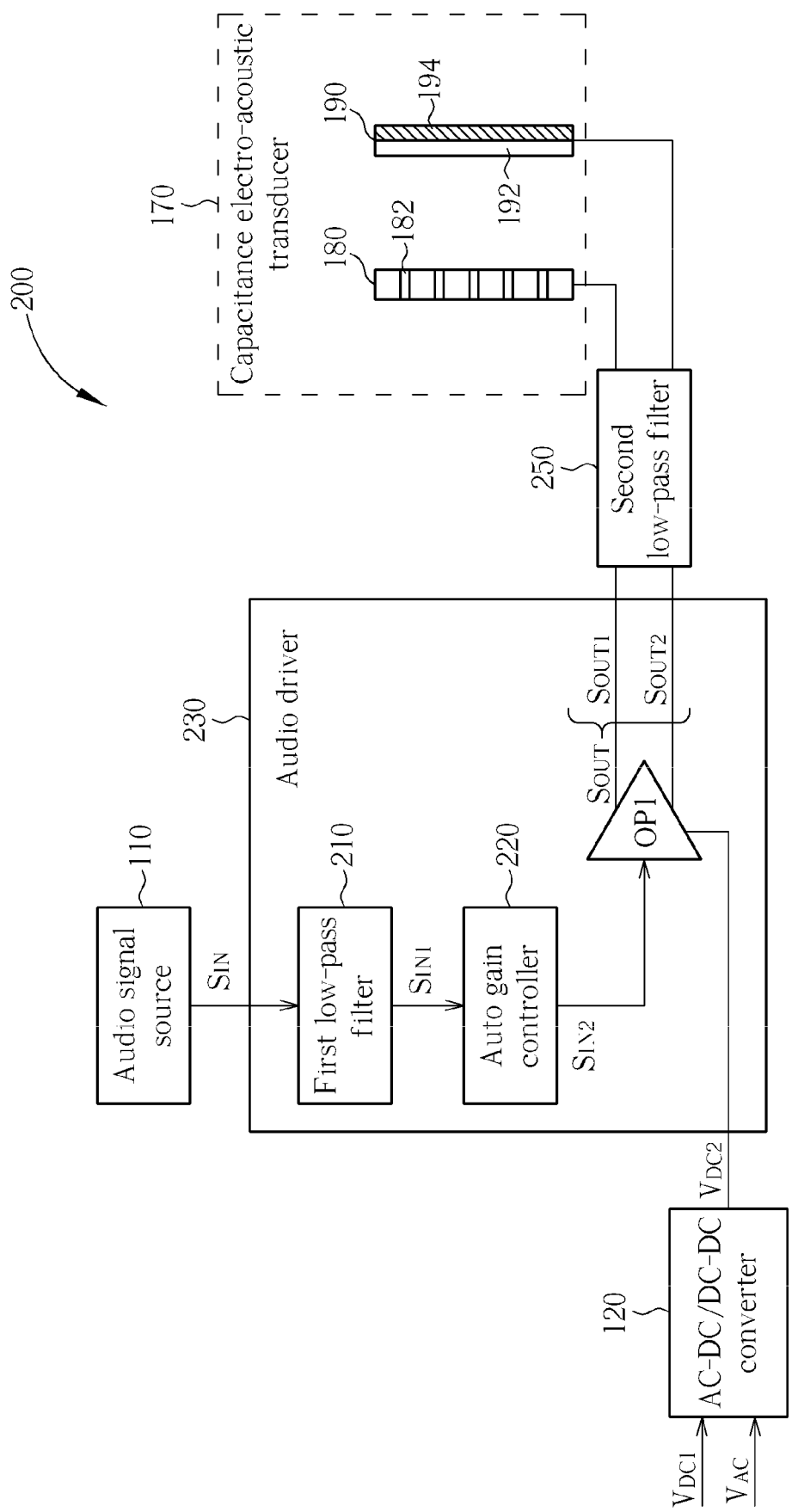
FIG. 2 is a diagram of an electronic device for driving a capacitance electro-acoustic transducer according to a second embodiment of the present invention.

Please refer to FIG. 2. FIG. 2 is a diagram of an electronic device 200 for driving a capacitance electro-acoustic transducer according to a second embodiment of the present invention. As shown in FIG. 2, the architecture of the electronic device 200 is similar to that of the electronic device 100, and the difference between them is that the electronic device 200 further includes a first low-pass filter 210, an auto gain controller (AGC) 220, and a second low-pass filter 250. The first low-pass filter 210 and the auto gain controller 220 are disposed inside the audio driver 230, and the second low-pass filter 250 is coupled between the high-voltage amplifier OP1 and the capacitance electro-acoustic transducer 170. The first low-pass filter 210 is coupled to the audio signal source 110 for performing a filtering operation on the input audio signal $S_{IN}$ to generate an input audio signal $S_{IN1}$, wherein the first low-pass filter 210 controls a bandwidth of the capacitance electro-acoustic transducer 170. For example, the bandwidth for voice communication of a mobile phone is merely 4 KHz, but the bandwidth for playing multimedia sound effects needs 10 KHz. The auto gain controller 220 is coupled between the first low-pass filter 210 and the high-voltage amplifier OP1 for adjusting a gain of the input audio signal $S_{IN1}$ to generate an input audio signal $S_{IN2}$.

Please note that the abovementioned high-voltage amplifier OP1 can be implemented by an AB class amplifier or a D class amplifier, but this should not be considered as a limitation of the present invention. The second low-pass filter 250 is coupled to the D class amplifier (i.e. the high-voltage amplifier OP1) for filtering signal components higher than a designated frequency within the output audio signal $S_{OUT}$.

Figure 3:
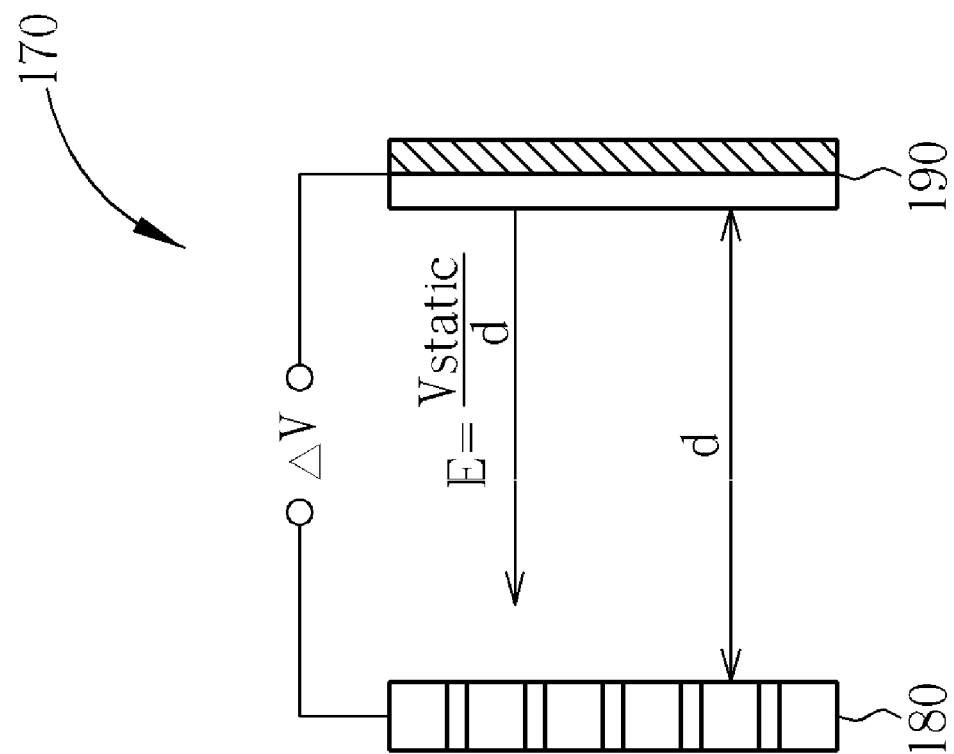
FIG. 3 is a diagram of the capacitance electro-acoustic transducer shown in FIG. 2.

Please refer to FIG. 3. FIG. 3 is a diagram of the capacitance electro-acoustic transducer 170 shown in FIG. 2. Because the capacitance electro-acoustic transducer 170 can be viewed as a capacitor (its capacitance is represented by C), the force (represented by F) of the electret diaphragm 190 of the capacitance electro-acoustic transducer 170 can be represented by the following equation:

$$F = C \times E \times \Delta V \quad (1)$$

The symbol C represents its capacitance, the symbol E represents the static electric field formed by static charges located on the electret diaphragm 190, and the symbol $\Delta V$ represents the voltage difference between the two ends of the capacitor (i.e., the voltage difference between the signals $S_{OUT1}$ and $S_{OUT2}$ received by the electret diaphragm 190 and the perforated electrode plate 180). In addition, the abovementioned capacitance C and the static electric field E can be respectively represented by the following equations:

$$C = \epsilon_r \times \epsilon_0 \times \frac{A}{d} \quad (2)$$

$$E = \frac{V_{static}}{d} \quad (3)$$

The symbol $\epsilon_r$ represents a dielectric constant of the vacuum, the symbol $\epsilon_0$ represents the relative dielectric constant, the symbol A represents the area of the capacitor (i.e., the area of the electret diaphragm 190 and the perforated electrode plate 180), the symbol d represents the distance between the two ends of the capacitor (i.e., the distance between the electret diaphragm 190 and the perforated electrode plate 180), and the symbol $V_{static}$ represents the static potential of the static charges located on the electret diaphragm 190. As can be known by substituting the equations (2) and (3) into the equation (1), the force F of the electret diaphragm 190 is directly proportional to the voltage difference $\Delta V$.

Moreover, the capacitance electro-acoustic transducer 170 can be viewed as a capacitor, and thus the capacitance C of the capacitance electro-acoustic transducer 170 can be generally defined by the following equation:

$$C = \frac{Q}{\Delta V} = \frac{I \times t}{\Delta V} = \frac{I \times 1/f}{\Delta V} \quad (4)$$

The symbol Q represents the quantity of electricity, the symbol $\Delta V$ represents the voltage difference between the two ends of the capacitor (i.e., the voltage difference between the signals $S_{OUT1}$ and $S_{OUT2}$ received by the electret diaphragm 190 and the perforated electrode plate 180), the symbol I represents the current value, the symbol t represents time, and the symbol f represents the bandwidth (i.e., the bandwidth of the capacitance electro-acoustic transducer 170). Because the quantity of electricity Q of the capacitor can also be represented by I multiplied by t and t is equal to 1/f, the relation between the bandwidth f and the current value I can be obtained by the equation (4), which is listed below:

$$f = \frac{I}{C \times \Delta V} \quad (5)$$

As can be seen from the equation (5), under a condition that the capacitance C and the voltage difference $\Delta V$ between the two ends of the capacitor are fixed, the bandwidth f is directly proportional to the current value I. In other words, the bandwidth f of the capacitance electro-acoustic transducer 170 can be determined by using the first low-pass filter 210 to control the current value I. For example, if the current value I is 2 mA, the bandwidth f is approximately 10 KHz. When the current value I is 1 mA, the bandwidth f is approximately 5 KHz. The frequency range that human ears can receive is approximately 20 Hz-20 KHz, wherein the percentage of 10 KHz-20 KHz is very tiny (about 1%-5%). The bandwidth f of the capacitance electro-acoustic transducer 170 can be designed to be smaller than 10 KHz by decreasing the current value I to reduce the power consumption of the capacitance electro-acoustic transducer 170. The abovementioned 10 KHz is merely an example for illustrating the present invention, and should not be a limitation of the present invention. Those skilled in the art should appreciate that the bandwidth f of the capacitance electro-acoustic transducer 170 can be designed depending on practical demands.

Furthermore, the power consumption of the capacitance electro-acoustic transducer 170 can be represented by the following equation:

$$W = \frac{1}{2} \times C \times \Delta V \tag{6}$$

Because the voltage difference $\Delta V$ is around several hundreds voltage (such as 168 Vpp) and the capacitance C is in the pico-level or nano-level (usually lies in between 20 pF and 20 nF), the power consumption of the capacitance electro-acoustic transducer 170 is in the micro-level (merely $\mu W$). For example, when the output sound volume is a stereo with 93 db-100 dB, the total power consumption of the AC-DC/DC-DC converter 120, the audio driver 130, and the capacitance electro-acoustic transducer 170 is merely 420 mW, which is much lower than the power consumption of 1.5 W-2 W consumed by the traditional dynamic speaker driven by large currents/low voltages. Hence, through adopting the high-voltage amplifier with high voltages/low currents disclosed in the present invention to drive the capacitance electro-acoustic transducer 170, triple or four times of the power consumption can be saved.

Because the current value I of the capacitance electro-acoustic transducer 170 directly affects the power consumption of the whole system, the first low-pass filter 210 can be used to limit current or a current-limiting function of the high-voltage amplifier OP1 itself can be used for reducing power consumption.

Figure 4:
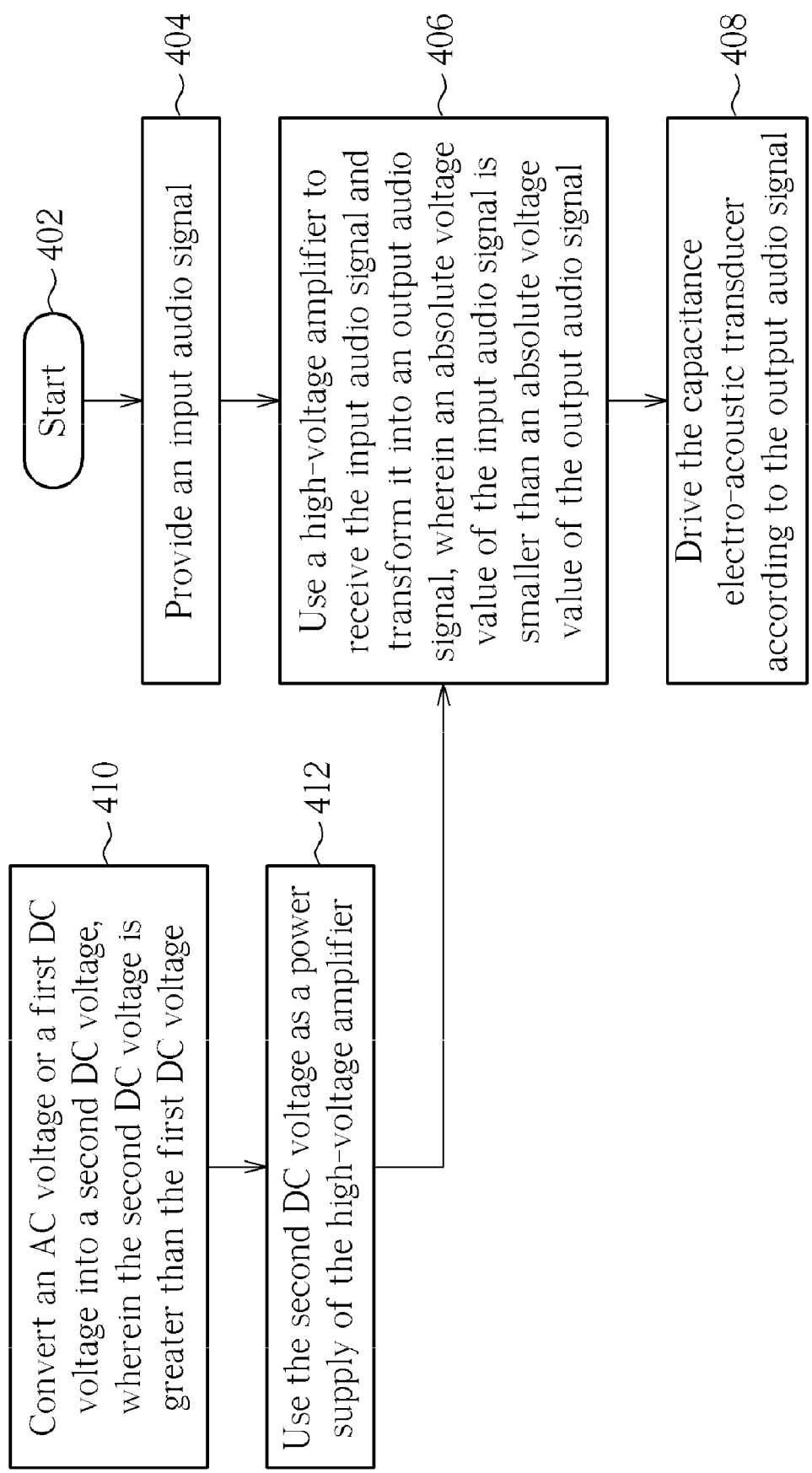
FIG. 4 is a flowchart illustrating a method for driving a capacitance electro-acoustic transducer according an exemplary embodiment of the present invention.

FIG. 4 is a flowchart illustrating a method for driving a capacitance electro-acoustic transducer according an exemplary embodiment of the present invention. Please note that the following steps are not limited to be performed according to the exact sequence shown in FIG. 4 if a roughly identical result can be obtained. The method includes the following steps:

Step 402: Start.
Step 404: Provide an input audio signal.
Step 406: Use a high-voltage amplifier to receive the input audio signal and transform it into an output audio signal, wherein an absolute voltage value of the input audio signal is smaller than an absolute voltage value of the output audio signal.
Step 408: Drive the capacitance electro-acoustic transducer according to the output audio signal.
Step 410: Convert an AC voltage or a first DC voltage into a second DC voltage, wherein the second DC voltage is greater than the first DC voltage.
Step 412: Use the second DC voltage as a power supply of the high-voltage amplifier.

How each element operates can be known by collocating the steps shown in FIG. 4 and the elements shown in FIG. 1. Thus further description of the steps shown in FIG. 4 is omitted here for brevity. Be noted that the steps of the abovementioned flowchart is merely an exemplary embodiment of the present invention, and in no way should be considered to be limitations of the scope of the present invention. The method can include other intermediate steps without departing from the spirit of the present invention.

Figure 5:
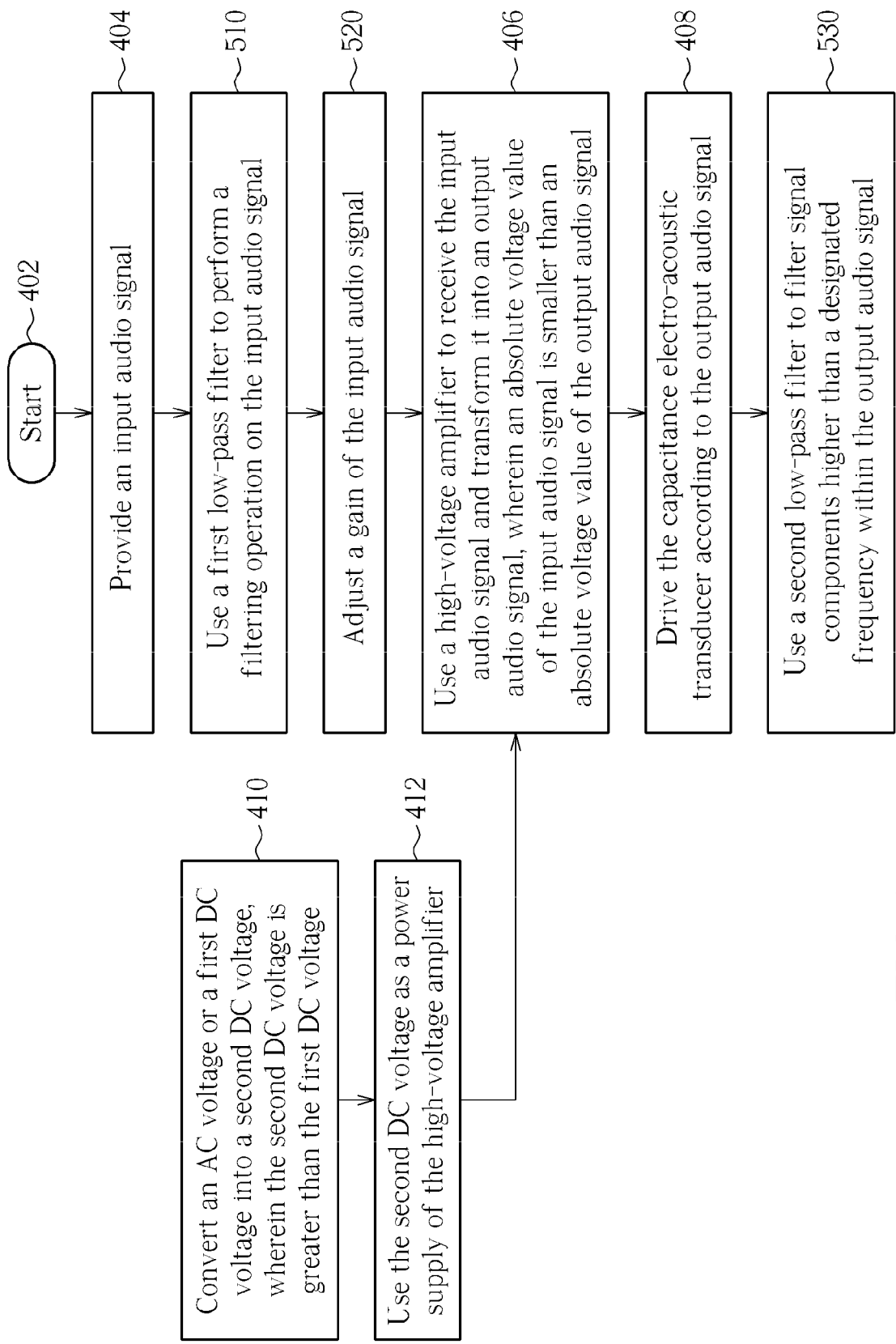
FIG. 5 is a flowchart illustrating a method for driving a capacitance electro-acoustic transducer according another exemplary embodiment of the present invention.

Please refer to FIG. 5. FIG. 5 is a flowchart illustrating a method for driving a capacitance electro-acoustic transducer according another exemplary embodiment of the present invention. The method includes, but is not limited to, the following steps:

Step 402: Start.
Step 404: Provide an input audio signal.
Step 510: Use a first low-pass filter to perform a filtering operation on the input audio signal.
Step 520: Adjust a gain of the input audio signal.
Step 406: Use a high-voltage amplifier to receive the input audio signal and transform it into an output audio signal, wherein an absolute voltage value of the input audio signal is smaller than an absolute voltage value of the output audio signal.
Step 408: Drive the capacitance electro-acoustic transducer according to the output audio signal.
Step 530: Use a second low-pass filter to filter signal components higher than a designated frequency within the output audio signal.
Step 410: Convert an AC voltage or a first DC voltage into a second DC voltage, wherein the second DC voltage is greater than the first DC voltage.
Step 412: Use the second DC voltage as a power supply of the high-voltage amplifier.

Please note that the steps in FIG. 5 are similar to the steps in FIG. 4, which is a varied embodiment of FIG. 4. The difference between them is that the flowchart in FIG. 5 further adds the functions of the filtering operation (i.e., Step 510), the gain adjusting operation (i.e., Step 520), and the high-frequency filtering operation (i.e., Step 530). How each element operates can be known by collocating the steps shown in FIG. 5 and the elements shown in FIG. 2, and further description of the steps shown in FIG. 5 is omitted here for brevity. The Step 510 is executed by the first low-pass filter 210, Step 520 is executed by the auto gain controller 220, and Step 530 is executed by the second low-pass filter 250.

The abovementioned embodiments are presented merely for describing the present invention, and in no way should be considered to be limitations of the scope of the present invention. In summary, the present invention provides a method and a related electronic device for driving the capacitance electro-acoustic transducer with high voltages/low currents. Be compared with the traditional dynamic speaker driven by the amplifier with large currents/low voltages, triple or four times of the power consumption can be saved through adopting the high-voltage amplifier with high voltages/low currents disclosed in the present invention to drive the capacitance electro-acoustic transducer 170 if their output sound volumes are the same (such as a stereo of 93-100 dB). In addition, the output sound of the capacitance electro-acoustic transducer 170 is a plane wave, which is different from a spherical wave outputted by the traditional dynamic speaker and can effectively reduce echo to improve the communicating quality of a mobile phone in a speaker mode. Furthermore, because the capacitance electro-acoustic transducer 170 can be viewed as a capacitor, the bandwidth f is directly proportional to the current value I under a condition that the capacitance C and the voltage difference ΔV between the two ends of the capacitor are fixed. Therefore, the bandwidth f of the capacitance electro-acoustic transducer 170 can be determined by using the first low-pass filter 210 to control the current value I. If the current value I is decreased, the bandwidth f of the capacitance electro-acoustic transducer 170 is lowered to 4 KHz to be suitable for the bandwidth of a voice communication of a mobile phone, which can also reduce the power consumption of the audio driver 130 and the capacitance electro-acoustic transducer 170. If the current value I is increased, the bandwidth of the capacitance electro-acoustic transducer 170 can be increased to above 10 KHz to be suitable for playing multimedia sound effects, which also keeps perfect sound quality.

Those skilled in the art will readily observe that numerous modifications and alterations of the device and method may be made while retaining the teachings of the invention.

What is claimed is:

1. An electronic device, comprising:
    a capacitance electro-acoustic transducer;
    an audio driver, coupled to the capacitance electro-acoustic transducer, the audio driver comprising a high-voltage amplifier for receiving an input audio signal and for transforming the input audio signal into an output audio signal to drive the capacitance electro-acoustic transducer, wherein an absolute voltage value of the input audio signal is smaller than an absolute voltage value of the output audio signal; and
    a first low-pass filter, for receiving the input audio signal and for performing a filtering operation on the input audio signal, wherein the first low-pass filter controls a current value of the capacitance electro-acoustic transducer, based on a condition that the current value of the capacitance electro-acoustic transducer is proportional to a bandwidth of the capacitance electro-acoustic transducer, to determine the bandwidth of the capacitance electro-acoustic transducer depending on a practical application of the electronic device;
    wherein a bandwidth of the capacitance electro-acoustic transducer controlled by the first low-pass filter when the electronic device has a voice communication application is less than a bandwidth of the capacitance electro-acoustic transducer controlled by the first low-pass filter when the electronic device has a multimedia sound playing application.

2. The electronic device of claim 1, further comprising:
    an AC-DC/DC-DC converter, coupled to the high-voltage amplifier, for converting an AC voltage or a first DC voltage into a second DC voltage, the second DC voltage being greater than the first DC voltage;
    wherein the second DC voltage acts as a power supply of the high-voltage amplifier.

3. The electronic device of claim 2, wherein the first DC voltage is substantially 2.5V-5V, and the second DC voltage is substantially 80V-100V.

4. The electronic device of claim 1, wherein the audio driver further comprises:
    an auto gain controller (AGC), coupled between the first low-pass filter and the high-voltage amplifier, for adjusting a gain of the input audio signal.

5. The electronic device of claim 1, wherein the input audio signal is a single-ended signal or a pair of differential signals.

6. The electronic device of claim 1, wherein the output audio signal is a single-ended signal, and an electret diaphragm of the capacitance electro-acoustic transducer receives the single-ended signal and a perforated electrode plate of the capacitance electro-acoustic transducer is coupled to the ground.

7. The electronic device of claim 1, wherein the output audio signal is a pair of differential signals, and a perforated electrode plate of the capacitance electro-acoustic transducer receives a first signal of the pair of differential signals and an electret diaphragm of the capacitance electro-acoustic transducer receives a second signal of the pair of differential signals.

8. The electronic device of claim 1, wherein the high-voltage amplifier is an AB class amplifier or a D class amplifier.

9. The electronic device of claim 8, further comprising:
    a second low-pass filter, coupled to the D class amplifier, for filtering signal components higher than a designated frequency within the output audio signal.

10. The electronic device of claim 1, wherein the capacitance electro-acoustic transducer is an electret speaker or an electret earphone.

11. A method for driving a capacitance electro-acoustic transducer of an electronic device, comprising:
    using a high-voltage amplifier to receive an input audio signal, and transforming the input audio signal into an output audio signal, wherein an absolute voltage value of the input audio signal is smaller than an absolute voltage value of the output audio signal;
    driving the capacitance electro-acoustic transducer according to the output audio signal; and
    using a first low-pass filter to receive the input audio signal and to perform a filtering operation on the input audio signal;
    controlling a current value of the capacitance electro-acoustic transducer, based on a condition that the current value of the capacitance electro-acoustic transducer is proportional to a bandwidth of the capacitance electro-acoustic transducer, to determine the bandwidth of the capacitance electro-acoustic transducer depending on a practical application of the electronic device by utilizing the first low-pass filter;
    wherein a bandwidth of the capacitance electro-acoustic transducer controlled by the first low-pass filter when the electronic device has a voice communication application is less than a bandwidth of the capacitance electro-acoustic transducer controlled by the first low-pass filter when the electronic device has a multimedia sound playing application.

12. The method of claim 11, further comprising:
    converting an AC voltage or a first DC voltage into a second DC voltage, wherein the second DC voltage is greater than the first DC voltage; and
    using the second DC voltage as a power supply of the high-voltage amplifier.

13. The method of claim 12, wherein the first DC voltage is substantially 2.5V-5V, and the second DC voltage is substantially 80V-100V.

14. The method of claim 11, further comprising:
    adjusting a gain of the input audio signal.

15. The method of claim 11, wherein the input audio signal is a single-ended signal or a pair of differential signals.

16. The method of claim 11, wherein the output audio signal is a single-ended signal or a pair of differential signals.

* * * * *